(12) United States Patent
Saito et al.

(10) Patent No.: US 7,196,475 B2
(45) Date of Patent: Mar. 27, 2007

(54) IMAGE FORMING APPARATUS UTILIZING A PIEZOELECTRIC-TRANSFORMER HIGH-VOLTAGE POWER SUPPLY AND METHOD FOR CONTROLLING THE SAME

(75) Inventors: Tohru Saito, Mishima (JP); Masahiro Suzuki, Numazu (JP); Osamu Nagasaki, Numazu (JP); Jun Haruna, Sunto-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/333,075

(22) Filed: Jan. 17, 2006

(65) Prior Publication Data

US 2007/0018589 A1   Jan. 25, 2007

(30) Foreign Application Priority Data

Jul. 21, 2005   (JP) .............................. 2005-211225

(51) Int. Cl.
*H01J 7/44* (2006.01)
*H05B 37/02* (2006.01)
*H01L 41/00* (2006.01)

(52) U.S. Cl. .................. 315/55; 315/209 PZ; 310/311

(58) Field of Classification Search ................ 315/32, 315/55, 57, 70, 209 PZ; 310/311, 314, 318, 310/319; 399/88, 134, 145, 152, 154, 222
See application file for complete search history.

(56) References Cited

U.S. PATENT DOCUMENTS 4,749,897 A * 6/1988 Natsume et al. ............ 310/317
5,923,542 A * 7/1999 Sasaki et al. ................. 363/16
6,028,388 A * 2/2000 Shimada ...................... 310/318
6,198,198 B1 * 3/2001 Fujimura et al. ....... 310/316.01
6,654,221 B2 * 11/2003 Noma et al. ............... 361/91.1
6,724,126 B2 * 4/2004 Chou ......................... 310/318
2002/0121865 A1 * 9/2002 Nakatsuka et al. ... 315/209 PZ

FOREIGN PATENT DOCUMENTS

JP   11-206113 A   7/1999

* cited by examiner

*Primary Examiner*—Thuy Vinh Tran
(74) *Attorney, Agent, or Firm*—Canon U.S.A., Inc IP Division

(57) ABSTRACT

A piezoelectric-transformer high-voltage power supply in combination with an image-forming apparatus including a latent-image forming section configured to form an electrostatic latent image on an image carrier, a developing section configured to form a toner image on the electrostatic latent image, and a transfer section configured to transfer the toner image onto a transfer material includes a piezoelectric transformer; a piezoelectric-transformer drive circuit; an output-voltage setting-signal output circuit configured to output an output-voltage setting-signal; an output-voltage detector circuit, and a drive control circuit configured to output a control signal on the basis of a signal from the output-voltage detector circuit and the output-voltage setting-signal, for controlling the piezoelectric-transformer drive circuit. The output-voltage setting-signal output circuit outputs an output-voltage setting-signal corresponding to a voltage lower than a target voltage and, then, another output-voltage setting-signal corresponding to the target voltage.

13 Claims, 8 Drawing Sheets

IMAGE FORMING APPARATUS UTILIZING A PIEZOELECTRIC-TRANSFORMER HIGH-VOLTAGE POWER SUPPLY AND METHOD FOR CONTROLLING THE SAME

BACKGROUND OF THE INVENTION

1. Field of the Invention

The present invention relates to an imaging apparatus which utilizes a piezoelectric-transformer high-voltage power supply, and a method for controlling the same.

2. Description of the Related Art

In an image-forming apparatus of an electrophotographic process type, reduction in the size and weight of a high-voltage power supply adapted for providing a direct-current bias voltage and the like involved in forming an image by a transfer section leads to reduction in the size and weight of the image-forming apparatus. Hence, in place of an electromagnetic transformer of a winding type, making use of a thin, light, and high-power piezoelectric transformer has been studied so as to serve as a transformer of a high-voltage power supply.

Use of a piezoelectric-transformer composed of a ceramic material enables the high-voltage power supply to generate a high voltage with a higher efficiency than that of the electromagnetic transformer, and in addition, to keep the distance between electrodes of the primary and secondary of the transformer separated, regardless of coupling between the primary and secondary. Accordingly, a mold coating especially for insulating the transformer can be eliminated, resulting in reduction in the size and weight of the high-voltage power supply. Such a piezoelectric-transformer high-voltage power supply is disclosed, e.g., in Japanese Patent Laid-Open No. 11-206113.

With respect to output vs. frequency, a piezoelectric-transformer generally has a characteristic having a bell-bottom shape exhibiting the maximum output voltage at its resonant frequency. Accordingly, changing the driving frequency allows the piezoelectric-transformer to variably control an output voltage. For example, changing the driving frequency from a value sufficiently high than the resonant frequency to a lower value (still higher than the resonant frequency) allows the piezoelectric-transformer to increase the output voltage.

In a comparator circuit, an output-voltage setting signal voltage and an output-voltage detecting signal are compared to each other. A voltage value of the compared result is input into a voltage control oscillator (VCO) and subjected to frequency conversion (V-F conversion), and the piezoelectric-transformer is driven at the frequency. The output voltage is raised or lowered by setting the output-voltage setting signal at a level corresponding to a desired target voltage or an OFF state of the output voltage, respectively. In order to achieve a normal operation of a feedback circuit for comparing the output-voltage setting signal and the output-voltage detecting signal to each other without causing a voltage control oscillator (VCO) to suffer from circuit oscillation in its control operation, a time constant of each of the output-voltage setting signal and the output-voltage detecting signal must be appropriately set.

Unfortunately, setting the time constant so as to prevent the circuit oscillation causes deterioration in a response of an output (a longer rising/falling time), results in an unacceptable response time (i.e., too long). For example, in cases where a high-voltage is supplied in a transfer roller of the image forming apparatus using the above-described piezo-electric-transformer high-voltage power supply, a faulty charging occurs in the transfer roller by the longer rising/falling time, thereby causing a faulty transfer. The faulty transfer causes image quality deterioration. Therefore, the longer rising/falling response causes technical problems when the image forming apparatus is applied to the piezoelectric-transformer high-voltage power supply.

FIG. 7 illustrates an output-voltage rising characteristic of a transfer section, wherein the resistance of a resistor and the capacitance of a capacitor, within the comparator are respectively set at 1 MΩ and 4700 pF so as to provide an integral circuit constant at the input stage of the output-voltage setting signal, and, in order to raise the output voltage from 0V to +3.5 kVDC, a step signal from 0V to about 10V, serving as the output-voltage setting signal Vcont is input. In FIG. 7, the horizontal and vertical axes respectively represent time and voltage, and the upper and lower curves respectively represent the output-voltage Vout and the output-voltage setting signal Vcont. In this case, the rising time of the output voltage from 0V to a target voltage +3.5 kV is about 100 milli-seconds (ms), which is longer than when a winding electromagnetic transformer is used (about 40 ms).

Therefore, the longer rising time inherent with the known control technique used with the piezoelectric-transformer high-voltage power supply in an image forming apparatus (as compared to electromagnetic transformers), produces an undesirable effect of deterioration in a response of an output (a longer rising/falling time).

SUMMARY OF THE INVENTION

The present invention is directed to piezoelectric-transformer high-voltage power supply, which prevents a voltage control oscillator (VCO) and an output voltage from oscillation and ensures stable output of a high-voltage with an easy method in a rising time free from unacceptable latent response times, and an image-forming apparatus having the piezoelectric-transformer high-voltage power supply incorporated therein. Moreover, the present invention provides a method for controlling the piezoelectric-transformer high-voltage power supply incorporated within the imaging apparatus.

According to the present invention, a piezoelectric-transformer high-voltage power supply for use in an image-forming apparatus includes a latent-image forming section configured to form an electrostatic latent image on an image carrier, a developing section configured to form a toner image on the electrostatic latent image, and a transfer section configured to transfer the toner image onto a transfer material includes a piezoelectric transformer; a piezoelectric-transformer drive circuit; an output-voltage setting-signal output circuit configured to output an output-voltage setting-signal; an output-voltage detector circuit, and a drive control circuit configured to output a control signal on the basis of a signal from the output-voltage detector circuit and the output-voltage setting-signal, for controlling the piezoelectric-transformer drive circuit. The output-voltage setting-signal output circuit outputs an output-voltage setting-signal corresponding to a voltage lower than a target voltage and, then, another output-voltage setting-signal corresponding to the target voltage.

In the piezoelectric-transformer high-voltage power supply, a high voltage can be applied on at least one of the latent-image forming section, the developing section, and the transfer section.

The image-forming apparatus is of a type adapted to transport the transfer material by electrostatic adsorption-transportation and to transfer toner onto the transfer material and includes a belt and a static-charge adsorbing section configured to charge the transfer material so as to electrostatically adsorb the transfer material onto the belt. With this, in the piezoelectric-transformer high-voltage power supply, a high voltage can be applied on the static-charge adsorbing section.

In the piezoelectric-transformer high-voltage power supply, the output-voltage setting-signal output circuit is configured to output an output-voltage setting-signal so as to increase up to the target voltage in a stepwise manner.

According to the present invention, control of the voltage control oscillator (VCO) and an output voltage are prevented from oscillation with an easy method, thereby, stably outputting a high voltage in a rising time free from undesired latent response times. Additionally, according to the present invention, large margins for the control of the voltage control oscillator (VCO) and an output voltage can be kept.

Further embodiments, features and aspects of the present invention will become apparent from the following description of exemplary embodiments with reference to the attached drawings.

DESCRIPTION OF THE EXEMPLARY EMBODIMENTS

Numerous exemplary embodiments, features and aspects of the present invention are now herein described in detail with reference to the attached drawings.

First Exemplary Embodiment

Exemplary Imaging Apparatus

Figure 3:
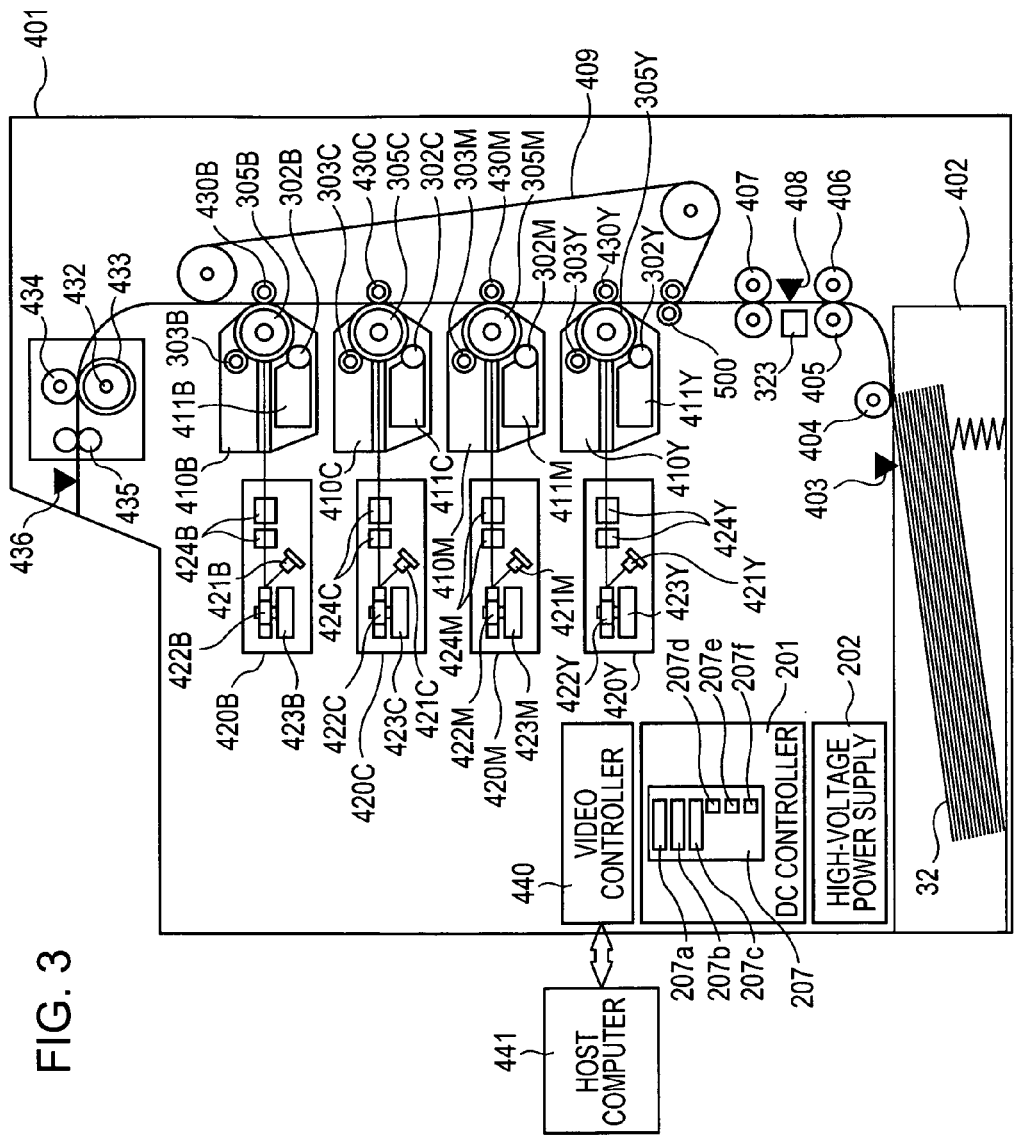
FIG. 3 illustrates the structure of an exemplary color laser printer according to an aspect the present embodiment.

FIG. 3 illustrates the structure of an exemplary color laser printer 401 serving as an exemplary image-forming apparatus (i.e., platform) according to the first embodiment. The laser printer 401 includes a deck 402 configured to store sheets of recording paper (hereinafter, referred to as recording papers) 32, each serving as a transfer material; a deck-paper detecting sensor 403 configured to detect presence of the recording paper 32 in the deck 402; a pickup roller 404 configured to deliver out the recording paper 32 from the deck 402; a deck-paper feeding roller 405 configured to transport the recording paper 32 delivered out by the pickup roller 404; and a retard roller 406 configured to pair off with the deck-paper feeding roller 405 and prevent the recording papers 32 from being transported in an overlapped manner. In addition, at the downstream of the deck-paper feeding roller 405, a registration roller pair 407 and a registration roller front sensor 408 are disposed, respectively, configured to synchronously transport the recording paper 32 and to detect the transporting state of the recording paper 32 to the registration roller pair 407. A media sensor 322 distinguishes the kind of paper (e.g., size of paper).

Also, at the downstream of the registration roller pair 407, an electrostatic-adsorbing transportation-transfer belt (hereinafter, referred to as an ETB) 409 is disposed. The ETB 409 has an absorption roller 500 disposed thereon, serving as an absorbing mechanism for charging the recording paper 32, serving as a transfer material, such that the recording paper 32 is electrostatically adsorbed to and transported by the ETB 409. On the ETB 409, images formed by an image forming section composed of process cartridges 410Y, 410M, 410C, and 410B and scanner units 420Y, 420M, 420C, and 420B respectively for four colors (yellow Y, magenta M, cyan C, and black B) (hereinafter, in a common description for four colors, referred to as, e.g., a process cartridge 410 by omitting reference characters "Y", "M, C", and "B"), which will be described later, are sequentially overlaid by transfer rollers 430Y, 430M, 430C, and 430B, thereby forming a color image and transferring it onto the recording paper 32.

Further downstream of the registration roller pair 407, as a fixing section configured to thermally fix a toner image transferred on the recording paper 32 to the same, a pair of a fixing sleeve 433 and a pressure roller 434 respectively serving as a fixing member having a heating heater 432 and a pressing mechanism are disposed. Also, in order to transport the recording paper 32 from the fixing sleeve 433, a fixed-paper discharging roller pair 435, and a fixed-paper discharging sensor 436 configured to detect the transporting state of the recording paper 32 from the fixing section are disposed.

Each of the scanner units 420 includes a laser unit 421 illuminating laser light modulated on the basis of the corresponding image signal transmitted from a video controller 440, which will be described later, two components of a polygon mirror 422 and a scanner motor 423 so as to scan the laser light emitted from the corresponding laser unit 421, on a corresponding photosensitive drum 305, and an image-forming lens group 424. Each of the process cartridges 410 includes the photosensitive drum 305, an electrostatic charging roller 303, a developing roller 302, and a toner cartridge 411, needed for a known electrophotographic process and detachable to the laser printer 401. Upon receiving image data transmitted from an external apparatus 441 such as a personal computer, the video controller 440 develops the image data as bitmap data and generates an image signal for forming an image.

A DC controller 201 serving as a control section of the laser printer includes, e.g., a micro-processing unit (MPU) 207 including a RAM 207a, a ROM 207b, a timer 207c, a digital input-output port 207d, a D/A port 207e, and an A/D port 207f, and a variety of input-output control circuits (not shown).

A high-voltage power supply 202 includes electrostatically charging high-voltage supplies (not shown), developing high-voltage power supplies (not shown), both corresponding to the respective process cartridges, and a transferring high-voltage power supply (not shown) including piezoelectric-transformers capable of outputting high voltages corresponding to the respective transfer rollers 430.

Architecture and Circuitry of an Exemplary Piezoelectric-Transformer High-Voltage Power Supply Referring now to a block diagram shown in FIG. 4, the architecture of an exemplary piezoelectric-transformer high-voltage power supply 202 according to the present embodiment will be described. Since the high-voltage power supply 202 according to the present invention is available for output circuits of both positive and negative voltages, a transferring high-voltage power supply typically requiring a positive voltage will be described below. While the transferring high-voltage power supply 202 includes four circuits corresponding to the transfer rollers 430Y, 430M, 430C, and 430B, the respective circuits have mutually the same structure. Hence, FIG. 4 illustrates only a single circuit.

Figure 4:
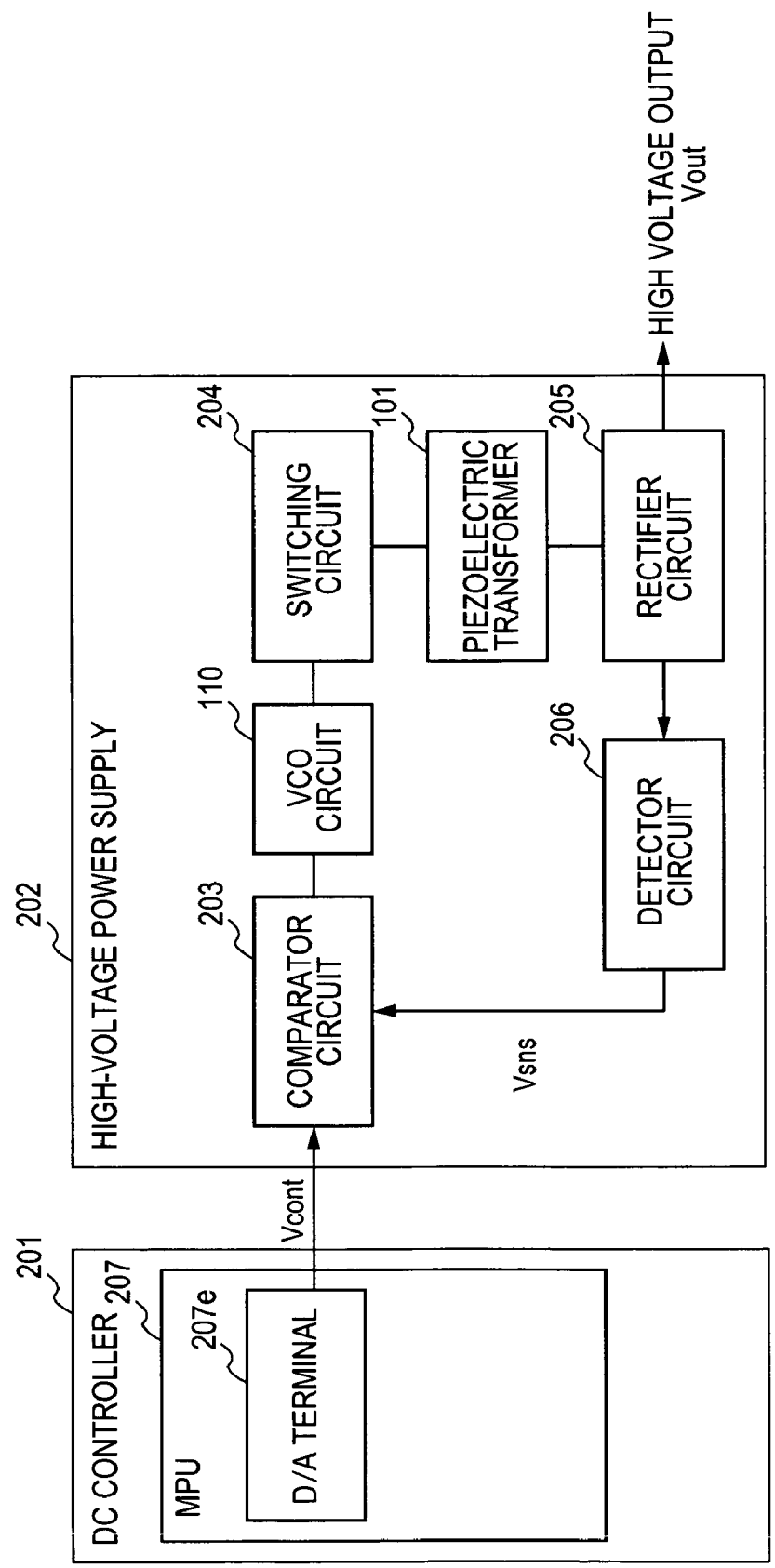
FIG. 4 is a block diagram of the architecture of an exemplary piezoelectric-transformer high-voltage power supply according to an aspect of the present invention.

Referring to FIG. 4, an output-voltage setting signal (i.e., an output-voltage control signal) Vcont is output from the D/A port 207e of the MPU 207 installed in the DC controller 201 serving as a control unit and is input into an integral circuit (a comparator circuit) 203 disposed on the high-voltage power supply 202 which includes an operational amplifier. An output of the integral circuit (the comparator circuit) 203 is converted into a frequency with a voltage-control oscillating circuit (VCO) 110, and a switching circuit 204 is driven at the frequency. A piezoelectric transformer (such as a ceramic piezoelectric transformer) 101 is activated so as to output a voltage in response to the frequency characteristic and the voltage step-up factor of a piezoelectric element. The transformer output voltage is rectified and smoothed with a rectifier circuit 205 so as to be a positive voltage as shown in the FIG. 4, for example, and a high voltage output Vout is supplied to the corresponding transfer roller 430 serving as a load. The smoothed voltage is fed back to the comparator circuit 203 via a detector circuit 206, and an output of the integral circuit (the comparator circuit) 203 is controlled such that an output-voltage detecting signal Vsns has the same voltage as that of the output-voltage setting signal Vcont.

Figure 2:
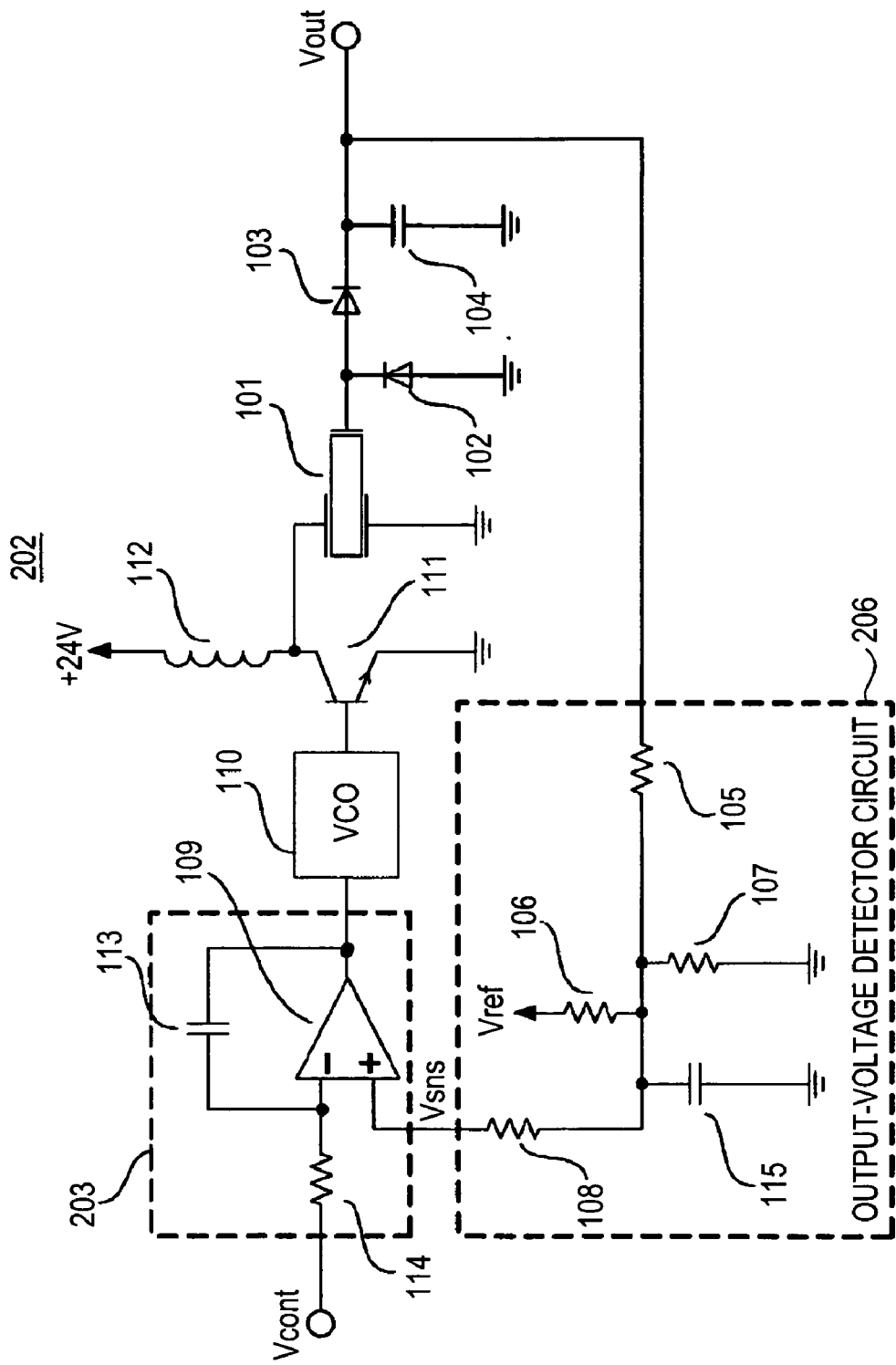
FIG. 2 is an exemplary circuit of a piezoelectric-transformer high-voltage power supply according to an aspect of the present invention.

Referring now to FIG. 2, a circuit of the piezoelectric-transformer high-voltage power supply 202 will be described. The circuit shown in FIG. 2 is an example of the high-voltage power supply 202 for use in a transfer section. An output of a piezoelectric-transformer (a piezoelectric ceramic transformer) 101 of a high-voltage power supply is rectified and smoothed by diodes 102 and 103, and a high-voltage capacitor 104 so as to be a positive voltage and is supplied to a transfer roller (e.g., from a color laser printer) serving as a load. In an output-voltage detector circuit 206, an output voltage Vout is divided by resistors 105, 106, and 107, and the divided voltage is output to a non-inverting input terminal (+terminal) of an operational amplifier 109 via a protection resistor 108 so as to serve as a Vsns.

The output-voltage detector circuit 206 functions as a filter circuit by configuring the resistors 105, 106, and 107, and a capacitor 115 as shown in FIG. 2. Accordingly, the level of the output-voltage detecting signal Vsns varies relative to the output voltage Vout, depending on the circuit time constant determined by part-constants of the resistors and the capacitor.

To another non-inverting input terminal (−terminal) of the operational amplifier 109, an output-voltage setting-signal (i.e., an output-voltage control signal) Vcont serving as an analog signal and information for setting an output voltage, of the high-voltage power supply is input from a DC controller (which will be described later) via a resistor 114.

By configuring the operational amplifier 109, the resistor 114, and a capacitor 113 as shown in FIG. 2, a comparator circuit 203 functions as an integral circuit, and the output-voltage setting signal Vcont is input to the operational amplifier 109 with an integral time constant determined by part-constants of the resister and the capacitor.

Since the output terminal of the operational amplifier 109 is connected to a voltage control oscillator (VCO) 110, power is supplied to the primary of the piezoelectric-transformer by driving a transistor 111 having its output terminal connected to an inductor 112.

Output Voltage vs. Driving Frequency

Figure 5:
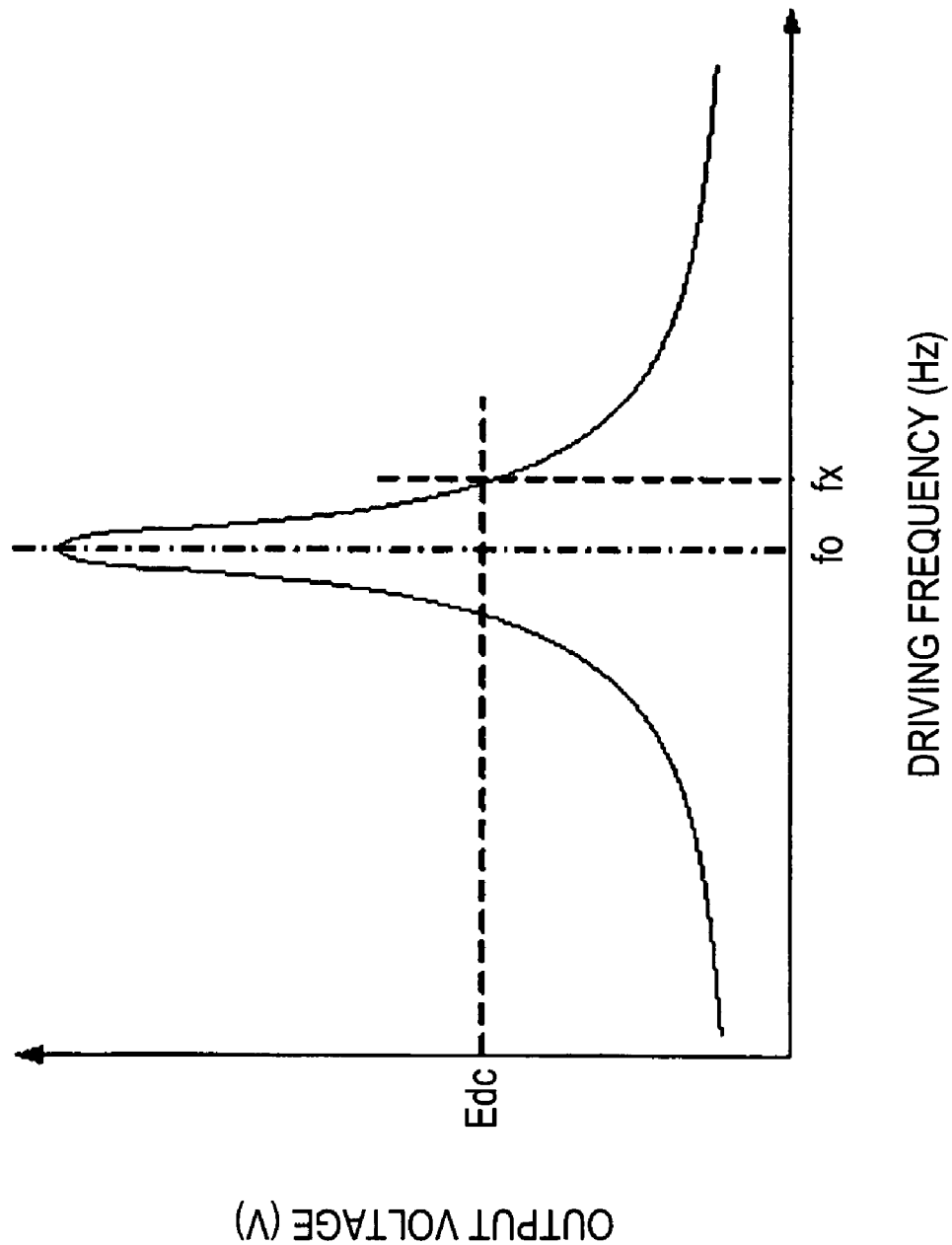
FIG. 5 is a graph illustrating the characteristic of the piezoelectric-transformer shown in FIG. 2, with respect to output voltage vs. driving frequency.

FIG. 5 is a graph illustrating the characteristic of the piezoelectric-transformer 101 with respect to output voltage vs. driving frequency. Here, the output voltage exhibits its maximum at the resonant frequency f0, thereby allowing the output voltage to be controlled in accordance with a frequency. A driving frequency upon outputting a prescribed output voltage Edc is defined by fx.

The voltage control oscillator (VCO) 110 operates so as to make its output frequency higher or lower as its input voltage increases or decrease, respectively. Under this condition, if the output voltage Vout increases slightly higher than that corresponding to the prescribed output voltage Edc of the piezoelectric-transformer 101, the input voltage Vsns of the non-inverting input terminal (+terminal) of the operational amplifier 109 also increases via the resistor 105, and a voltage of the output terminal of the operational amplifier 109 increases. In other words, increase in the input voltage of the voltage control oscillator 110 results in increase in the driving frequency of the piezoelectric-transformer 101.

Accordingly, the piezoelectric-transformer 101 is driven at a frequency slightly higher than the driving frequency fx. If the driving frequency is made higher, the output voltage of the piezoelectric-transformer 101 decreases. As a result, the circuit of the piezoelectric-transformer high-voltage power supply is controlled so as to make the output voltage Vout lower. That is, the circuit serves as a negative feedback control circuit.

When the output voltage Vout decreases lower than the prescribed output voltage Edc, the input voltage Vsns of the operational amplifier 109 also decreases, resulting in decrease in the voltage of the output terminal of the operational amplifier 109. In other words, since the output frequency of the voltage control oscillator 110 decreases, the piezoelectric-transformer 101 is controlled so as to increase its output voltage. As described above, the output voltage is subjected to constant current control so as to agree with the voltage Edc determined by the output-voltage setting signal (a setting voltage, hereinafter, also referred to as a voltage control signal) Vcont input from the DC controller 201 to the non-inverting input terminal (−terminal) of the operational amplifier 109.

The circuit 203 generating the output-voltage setting signal Vcont input from the DC controller 201 to the non-inverting input terminal (−terminal) of the operational amplifier 109 and the output-voltage detecting signal Vsns for detecting the output voltage and input into the non-inverting input terminal (+terminal) of the operational amplifier 109 is now herein described in detail below. Since the circuit 203 functions as an integral circuit by configuring the operational amplifier 109, the resistor 114, and the capacitor 113 as shown in FIG. 2, a signal varying relative to the setting signal Vconst of the output voltage, depending on a time constant Tconst determined by the part-constants of the resistor 114 and the capacitor 113 is input into the operational amplifier 109.

In the meantime, the greater the resistance of the resistor 114, the greater the Tconst. Likewise, the greater the capacitance of the capacitor 113, the greater the time constant Tconst. While a filter circuit is configured by the resistors 105, 106, and 107, and the capacitor 115, the output-voltage detecting signal Vsns varying relative to the output voltage Vout, depending on a time constant Tsns determined by the part-constants of the resistors 105, 106, and 107, and the capacitor 115, is input into the operational amplifier 109. By determining the constants of the resistor 114 and the capacitor 113 and the constants of the resistors 105, 106, and 107, and the capacitor 115 so as to satisfy the following expressions, the feedback control, which is free from oscillation, is established. That is, with the time constant Tsns smaller than the time constant Tconst, the output-voltage detecting signal rises quickly, thereby, allowing the feedback control to normally operate free from oscillation.

Tconst>Tsns,

Tconst=R114×C113, and

Tsns=$Rs$×C115, wherein R111 represents a resistance of the resistor 111, C113 and C115 respectively represent capacitances of the capacitors 113 and 115, and Rs represents a combined resistance of R105, R106, and R107 respectively representing resistances of the resistors 105, 106, and 107.

In the present embodiment, Tcont and Tsns are respectively set at 5 milli-seconds and 1 milli-second (hereinafter, simply represented by ms, and the same applies to the drawings). Greater time constants of Tcont and Tsns cause delayed feedback control, resulting in a delayed rising time of an output bias. Smaller time constants of Tcont and Tsns cause the driving frequency to be fed back to vary to a large extent and exceed the resonant frequency f0 of the piezoelectric transformer 101, resulting in failure in the feedback control. Hence, Tcont and Tsns can be set in the range from about 0.5 ms to about 100 ms (and, more particularly, in the respective ranges from about 1 ms to about 10 ms and from about 0.5 ms to about 5 ms).

Exemplary Piezoelectric-Transformer High-Voltage Power Supply According to the Present Invention Control for outputting a target voltage by using the aforementioned circuit in a piezoelectric-transformer high-voltage power supply 202 will now be described.

When a step voltage starting from 0V is input as the output setting voltage Vcont in order to output the target voltage, since the output voltage Vout starts from 0V and the output-voltage detecting signal Vsns, therefore, has a small value, a difference between the output-voltage setting signal Vcont and the output-voltage detecting signal Vsns is large. Accordingly, a frequency subjected to frequency conversion (V-F conversion) thereafter and allowing the piezoelectric-transformer to be driven thereat is high. As the output of the output voltage Vout becomes greater, the output-voltage detecting signal Vsns becomes greater, resulting in a smaller difference between the output-voltage setting signal Vcont and the output-voltage detecting signal Vsns, whereby, a frequency subjected to frequency conversion (V-F conversion) and allowing the piezoelectric-transformer to be driven, thereat, becomes gradually lower.

The piezoelectric-transformer has an output-voltage characteristic curve having a widening-toward-end shape having the center at its resonant frequency as shown in FIG. 5. The driving frequency varies in a manner of becoming lower from a frequency portion higher than the resonant frequency, lying in a broadened portion of the output voltage characteristic curve shown in FIG. 5, towards the peak portion at the resonant frequency portion. Hence, in the broadened portion of the output voltage characteristic curve, a variance in the output voltage is small relative to that in the driving frequency, resulting in a longer rising time of the output voltage from 0V to the target voltage.

Figure 1:
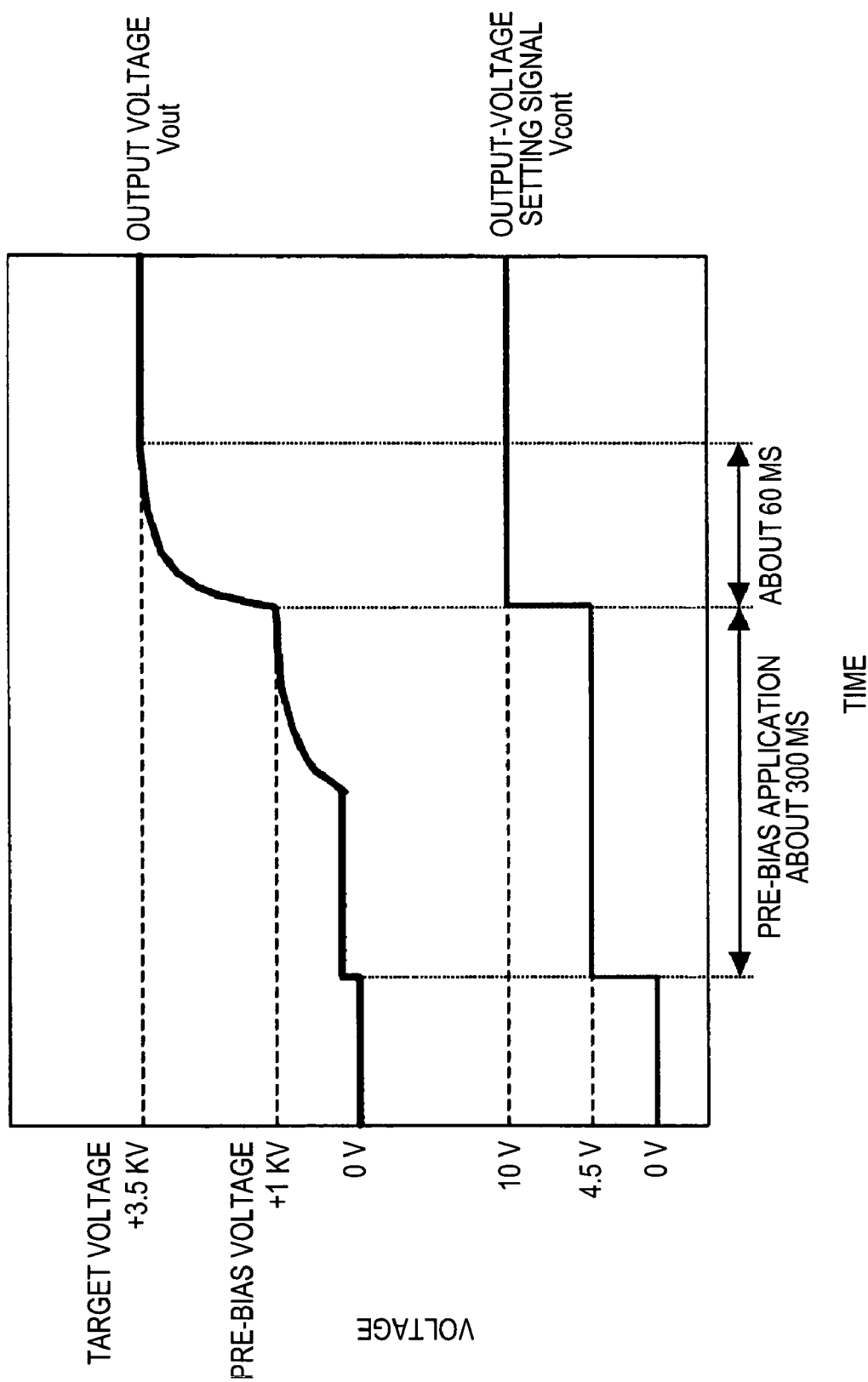
FIG. 1 is a graph illustrating exemplary output control of a piezoelectric-transformer high-voltage power supply according to a first embodiment of the present invention.

Therefore, in the present embodiment according to the present invention, a time for applying a pre-bias voltage lower than the target voltage is prepared, prior to outputting the target voltage, as shown in FIG. 1. In the present embodiment, with respect to the target voltage +3.5 kV of the transfer section, the pre-bias voltage value and a pre-bias application time are respectively set at +1 kV and about 300 ms by way of example.

In the present embodiment, prior to outputting the target voltage, the output voltage is risen from 0V to the pre-bias voltage and then up to the target voltage, the rising operation of the output voltage starting from the boarded portion of the output voltage characteristic curve of the piezoelectric-transformer results in starting from a portion close to the peak of the output voltage characteristic. Hence, a portion of the output voltage characteristic curve in which the output voltage varies drastically relative to a variance in the driving frequency can be made use of, thereby, quickly raising the output voltage.

As opposed to about 100 ms, the rising time in the present embodiment can be made as short as about 60 ms, free from the latent response problems experienced in known conventional systems.

In the present embodiment, while the pre-bias voltage and the application time are respectively set at +1 kV and about 300 ms by way of example, with respect to the target voltage +3.5 kV, the present invention is not limited to these values. That is, even when the pre-bias voltage and the application time are set at respectively appropriate values, the same advantages can be obtained.

While the high-voltage power supply 202 involved in forming an image by the transfer section has been described in the present embodiment, high-voltage power supplies involved in forming other images, e.g., by a latent-image forming section (the electrostatic charging rollers 303 shown in FIG. 3), a developing section (the developing roller 302 shown in FIG. 3), and a static-charge adsorbing section (the absorption roller 500 shown in FIG. 3) can be likewise implemented, and the same advantages can be achieved.

While a tandem-type color image-forming apparatus has been described as an example of the image-forming apparatus in the present embodiment, other-type image-forming apparatuses lie within the scope of the present invention as long as the apparatuses make use of high-voltage bias.

While the case where the output voltage is risen from 0V to the target voltage has been described in the present embodiment, the falling time can be likewise made shorter in the case of decreasing the output voltage from the target voltage to 0V, by controlling the output voltage so as to become 0V after temporarily decreasing it down to a voltage lower than the target voltage, instead of directly decreasing it from the target voltage down to 0V.

Second Exemplary Embodiment

A second embodiment of the present invention will now be described. Description of like parts as those described in the first embodiment is omitted.

Figure 6:
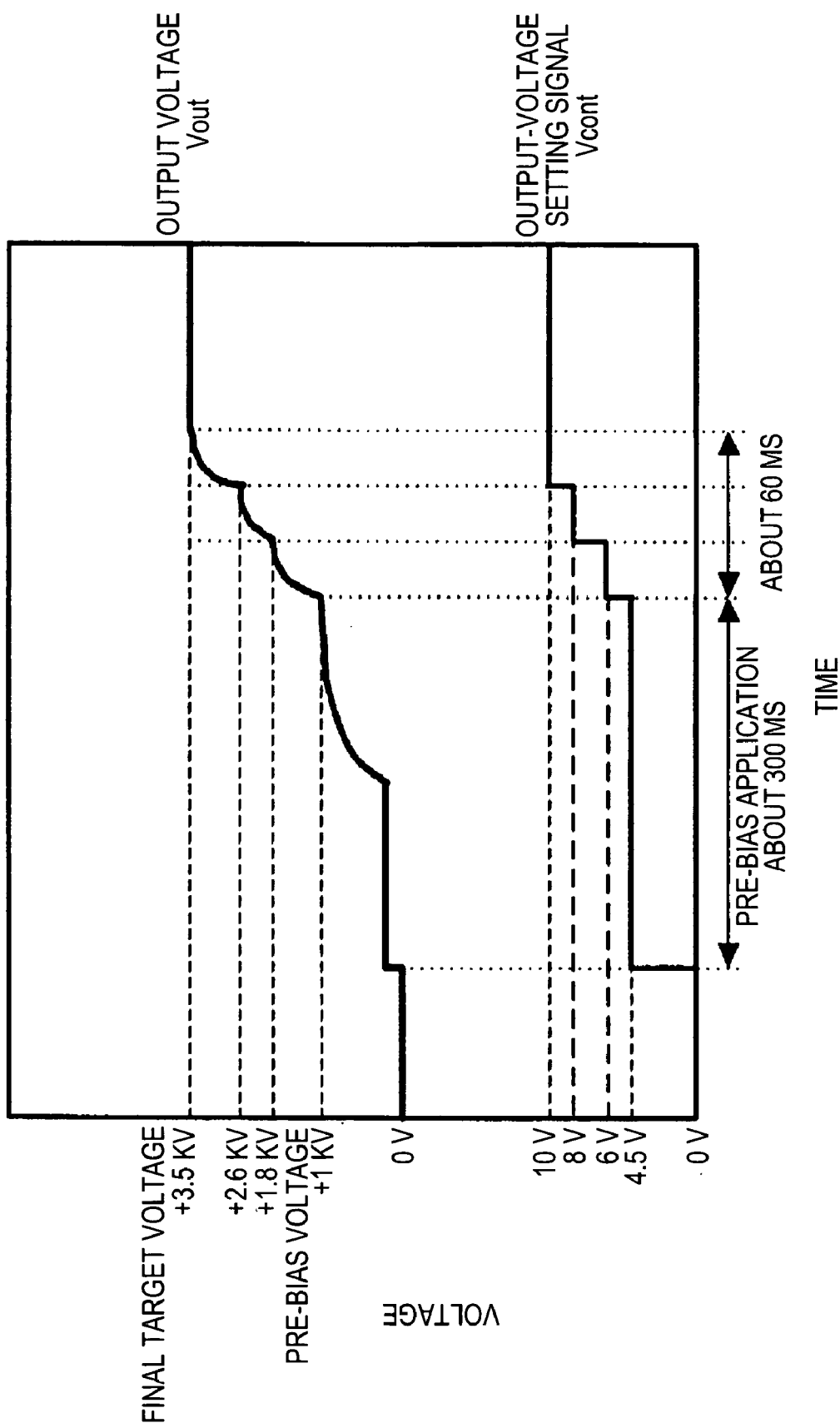
FIG. 6 is a graph illustrating exemplary output control of a piezoelectric-transformer high-voltage power supply according to a second embodiment of the present invention.
Figure 7:
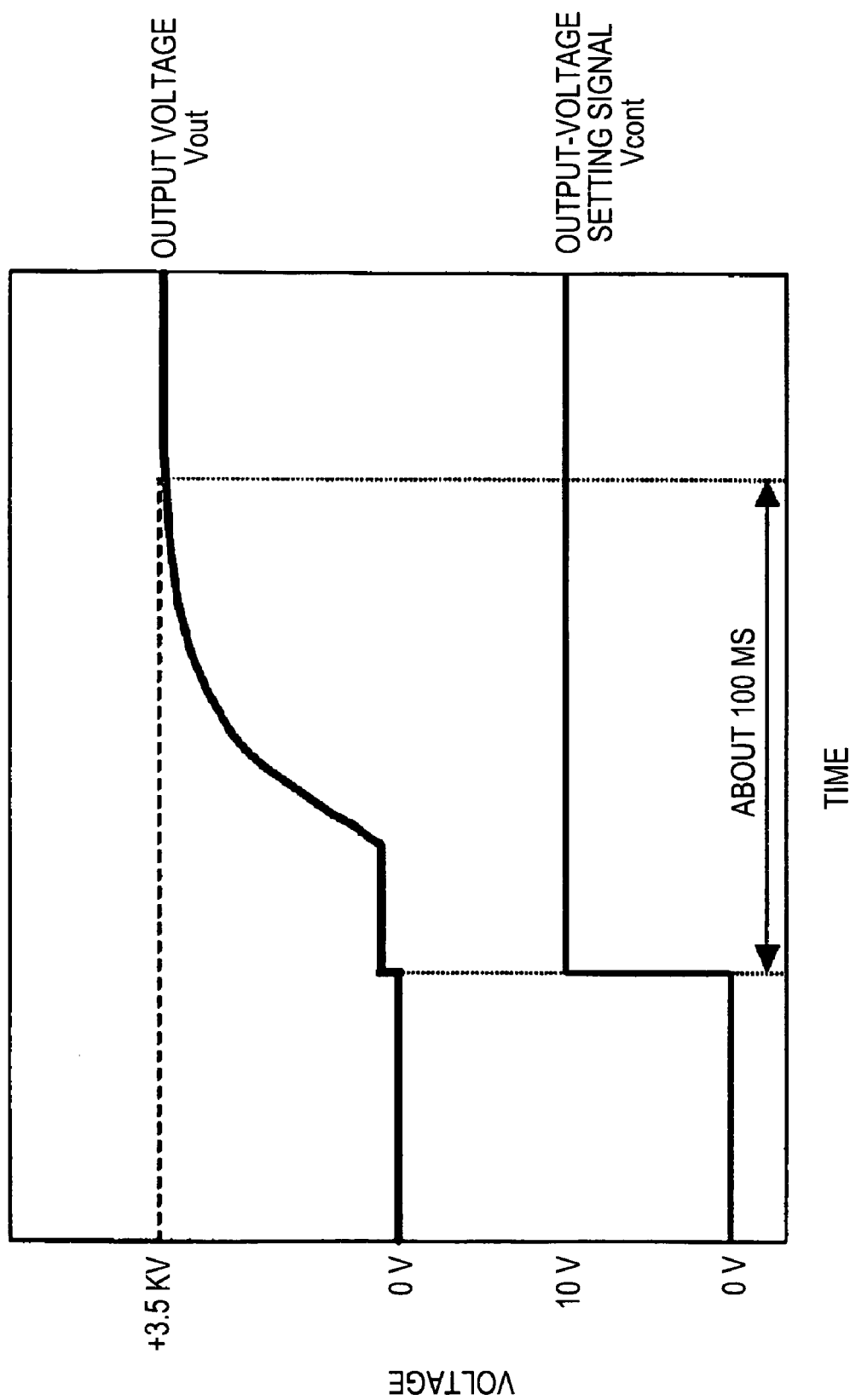
FIG. 7 is a graph illustrating output control of a known piezoelectric-transformer high-voltage power supply.

The second embodiment has a feature that, with respect to controlling an output of the piezoelectric-transformer high-voltage power supply 202, as shown in FIG. 6, the output is controlled so as to increase up to the final target voltage in a stepwise manner after having a pre-bias voltage applied thereon. In the present embodiment, by changing the voltage-controlling target value in three stages up to the final target voltage after application of the pre-bias voltage, the output voltage increases in a stepwise manner so as to attain the final target voltage.

In the circuit diagram shown in FIG. 2, with the integral circuit configured by the resistor 114 and the capacitor 113, an output-voltage setting voltage V in each stage input into the operational amplifier 109 of a voltage-comparing section (the comparator circuit 203 in the figure) changes with a waveform given by the following expression:

$$V = V_0 \times (1 - \exp(-t/\tau_{cont})),$$

wherein V0 represents a voltage difference in each stage and t represents time.

Figure 8:
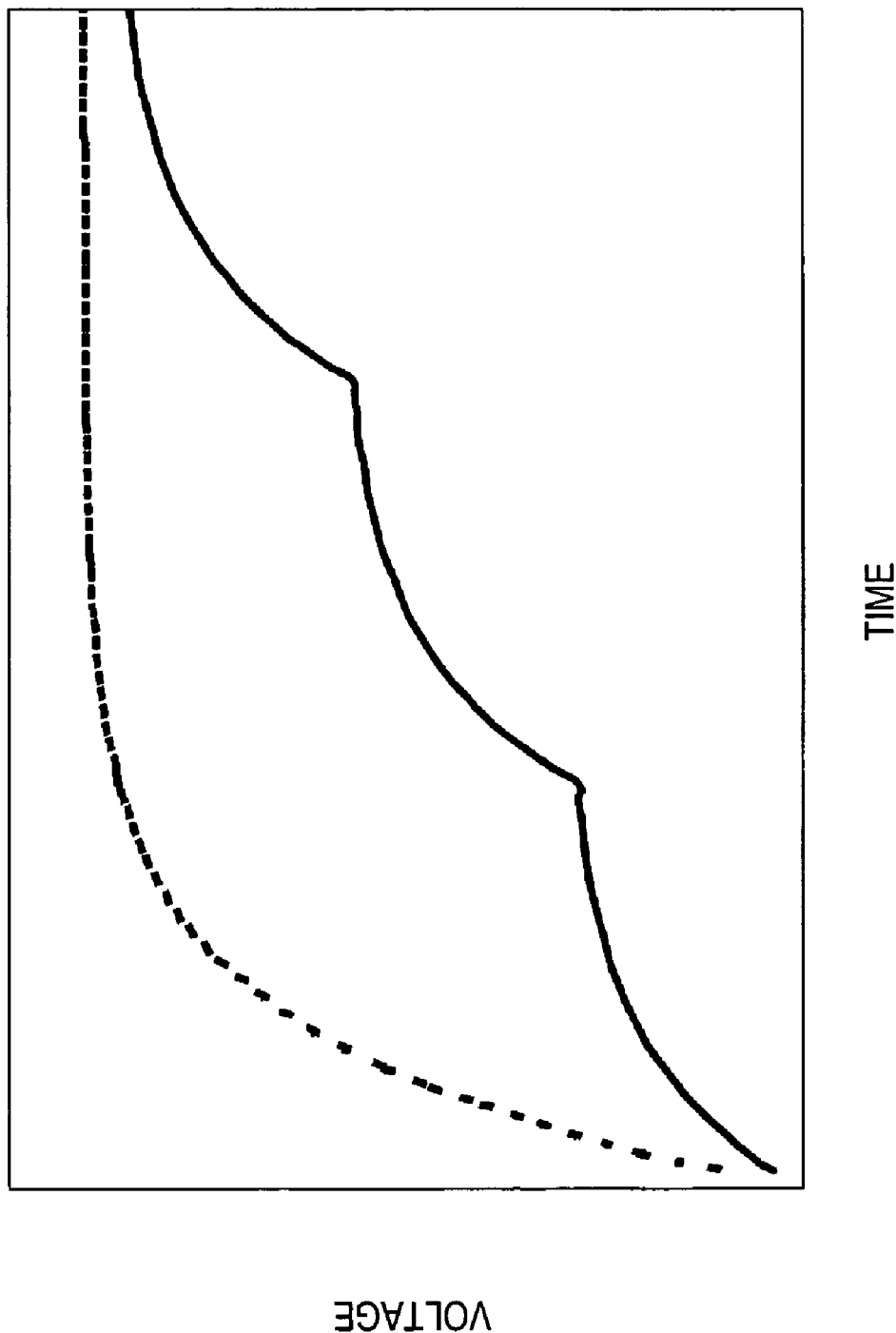
FIG. 8 is a graph illustrating a stepwise rising of an output-voltage setting signal after having a pre-bias voltage applied thereon in the second embodiment.

FIG. 8 is a graph illustrating two kinds of the output-voltage setting signals Vcont input in the operational amplifier 109 of the voltage-comparing section and passing through the integral circuit: one controlled so as to directly attain the target voltage as described in the first embodiment (indicated by a dotted line in FIG. 8) and the other controlled so as to attain up to the target voltage in three stages as described in the second embodiment (indicated by a solid line in FIG. 8).

Since dividing a rising operation of the voltage-rising stage into multiple stages as in the present embodiment makes the amount of integration per stage smaller, with respect to allowing the feedback circuit to normally operate for comparing the output-voltage setting signal Vcont and the output-voltage detecting signal Vsns with each other and preventing the voltage-control oscillator (VCO) 110 from circuit oscillation in its control operation, a greater margin than that in the first embodiment can be kept. On the contrary, keeping the margin the same as that in the first embodiment makes the time constant of the integral circuit smaller.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2005-211225 filed Jul. 21, 2005, which is hereby incorporated by reference herein in its entirety.

What is claimed is:

1. A piezoelectric-transformer high-voltage power supply in combination with an image-forming apparatus which includes a latent-image forming section configured to form an electrostatic latent image on an image carrier, a developing section configured to form a toner image on the electrostatic latent image, and a transfer section configured to transfer the toner image onto a transfer material, the piezoelectric-transformer high-voltage power supply comprising:

a piezoelectric transformer;

a piezoelectric-transformer drive circuit;

an output-voltage setting-signal output circuit configured to output an output-voltage setting-signal;

an output-voltage detector circuit; and a drive control circuit configured to output a control signal on the basis of a signal from the output-voltage detector circuit and the output-voltage setting-signal, for controlling the piezoelectric-transformer drive circuit, wherein the output-voltage setting-signal output circuit is configured to output an output-voltage setting-signal corresponding to a voltage lower than a target voltage, and then output another output-voltage setting-signal corresponding to the target voltage.

2. The piezoelectric-transformer high-voltage power supply according to claim 1, wherein a high voltage is applied on at least one of the latent-image forming section, the developing section, and the transfer section.

3. The piezoelectric-transformer high-voltage power supply according to claim 1, wherein the image-forming apparatus is of a type adapted to transport the transfer material by electrostatic adsorption-transportation and to transfer toner onto the transfer material and includes a belt and a static-charge adsorbing section configured to charge the transfer material so as to electrostatically adsorb the transfer material onto the belt, and wherein a high voltage is applied on the static-charge adsorbing section.

4. The piezoelectric-transformer high-voltage power supply according to claim 1, wherein the output-voltage setting-signal output circuit outputs an output-voltage setting-signal so as to increase up to the target voltage in a stepwise manner.

5. A piezoelectric-transformer high-voltage power supply for use in an image-forming apparatus including a latent-image forming section configured to form an electrostatic latent image on an image carrier, a developing section configured to form a toner image on the electrostatic latent image, and a transfer section configured to transfer the toner image onto a transfer material, comprising:

a piezoelectric transformer;

a piezoelectric-transformer drive circuit;

an output-voltage setting-signal output circuit configured to output an output-voltage setting-signal;

an output-voltage detector circuit, and a drive control circuit configured to output a control signal on the basis of a signal from the output-voltage detector circuit and the output-voltage setting-signal, for controlling the piezoelectric-transformer drive circuit, wherein the output-voltage setting-signal output circuit outputs an output-voltage setting-signal corresponding to a voltage lower than a target voltage, and then outputs another output-voltage setting-signal corresponding to the target voltage.

6. The piezoelectric-transformer high-voltage power supply according to claim 5, wherein a high voltage is applied on at least one of the latent-image forming section, the developing section, and the transfer section.

7. The piezoelectric-transformer high-voltage power supply according to claim 5, wherein the image-forming apparatus is of a type adapted to transport the transfer material by electrostatic adsorption-transportation and to transfer toner onto the transfer material and includes a belt and a static-charge adsorbing section configured to charge the transfer material so as to electro-statically adsorb the transfer material onto the belt, and wherein a high voltage is applied on the static-charge adsorbing section.

8. The piezoelectric-transformer high-voltage power supply according to claim 5, wherein the output-voltage setting-signal output circuit outputs an output-voltage setting-signal so as to increase up to the target voltage in a stepwise manner.

9. A method for controlling a piezoelectric-transformer high-voltage power supply in combination with an image-forming apparatus, the power supply including,
a piezoelectric transformer;
a piezoelectric-transformer drive circuit;
an output-voltage setting-signal output circuit configured to output an output-voltage setting-signal;
an output-voltage detector circuit; and
a drive control circuit;

the image-forming apparatus comprising,
a latent-image forming section configured to form an electrostatic latent image on an image carrier;
a developing section configured to form a toner image on the electrostatic latent image; and
a transfer section configured to transfer the toner image onto a transfer material;

the method comprising:
controlling the piezoelectric-transformer drive circuit by causing the drive control circuit to output a control signal on the basis of a signal from the output-voltage detector circuit and the output-voltage setting-signal, wherein the output-voltage setting-signal output circuit outputs an output-voltage setting-signal corresponding to a voltage lower than a target voltage, and then outputs another output-voltage setting-signal corresponding to the target voltage.

10. The method according to claim 9, further comprising applying a high voltage on at least one of the latent-image forming section, the developing section, and the transfer section.

11. The method according to claim 9, wherein the image-forming apparatus is of a type adapted to transport the transfer material by electrostatic adsorption-transportation and to transfer toner onto the transfer material and includes a belt and a static-charge adsorbing section configured to charge the transfer material so as to electro-statically adsorb the transfer material onto the belt.

12. The method according to claim 11, further comprising applying a high voltage on the static-charge adsorbing section.

13. The method according to claim 9, further comprising increasing the output-voltage setting-signal so as to increase up to the target voltage in a stepwise manner.

* * * * *